United States Patent [19]

Coyle et al.

[11] 4,179,594
[45] Dec. 18, 1979

[54] ILLUMINATED PUSHBUTTON ASSEMBLY

[75] Inventors: Forrest E. Coyle; Alan F. Mandel, both of Pittsburgh, Pa.

[73] Assignee: Westinghouse Electric Corp., Pittsburgh, Pa.

[21] Appl. No.: 941,610

[22] Filed: Sep. 12, 1978

[51] Int. Cl.² ............................................. H01H 9/02
[52] U.S. Cl. .................................. 200/310; 116/202; 200/292
[58] Field of Search .................. 116/124 L, DIG. 28, 116/202; 200/310, 311, 312, 314, 317, 292

[56] References Cited

U.S. PATENT DOCUMENTS 3,811,025  5/1974  Bach ...................................... 200/317
4,002,892  1/1977  Zielinski ........................... 200/292 X Primary Examiner—Frederick R. Schmidt
Attorney, Agent, or Firm—D. R. Lackey

[57] ABSTRACT

A pushbutton assembly illuminated with a plurality of solid state light sources, such as LEDs. The pushbutton assembly includes first and second spaced printed circuit boards which are electrically interconnected via electrical leads which also function to mechanically support the second printed circuit board from the first printed circuit board. The LEDs are mounted on the second printed circuit board, immediately adjacent to the front portion of the pushbutton assembly to be illuminated.

5 Claims, 12 Drawing Figures

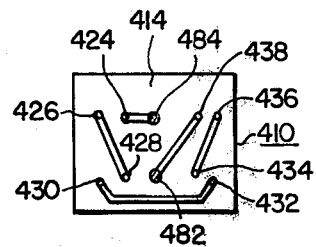
FIG.7.
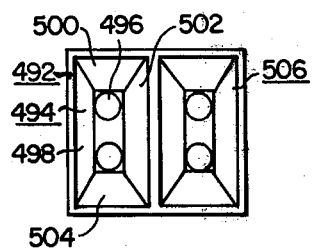
FIG.11.
FIG.9. 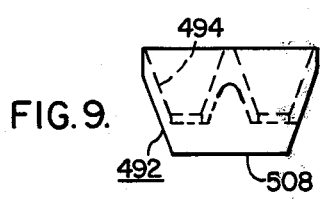 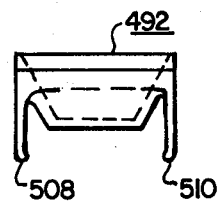 FIG.10.
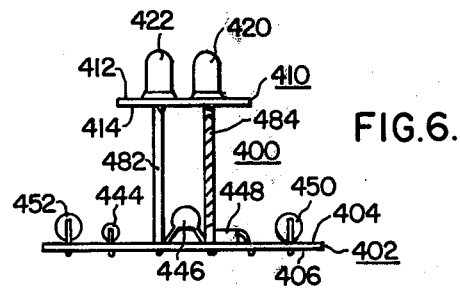
FIG.6.

ILLUMINATED PUSHBUTTON ASSEMBLY

BACKGROUND OF THE INVENTION

1. Field of the Invention

The invention relates in general to pushbuttons, and more specifically to pushbuttons illuminated with a solid state light source such as light emitting diodes (LED's).

2. Description of the Prior Art

Co-pending application Ser. No. 941,617, filed Sept. 12, 1978, in the name of F. E. Coyle, entitled "Pushbutton Assembly", which is assigned to the same assignee as the present application, discloses a new and improved pushbutton assembly suitable for use as a call button in an elevator system. Elevator pushbuttons, such as those used as an elevator call button in an elevator car, and elevator hall call buttons in the hall ways of a building, are subjected to constant usage by the public and thus must be built to withstand intense service. They're also subjected to considerable abuse, both intentional and unintentional. Thus, they must be constructed such that they do not invite vandalism. Further, they must be constructed to withstand abuse and vandalism, such as by being able to withstand actuation by an umbrella point, and extreme closing pressures, without external or internal damage.

Elevator pushbuttons must notify the sighted population that a call has been entered, by illuminating a predetermined portion of the pushbutton after actuation, and the illumination must be maintained until the call is answered. It would also be desirable to construct elevator pushbuttons such that they may be easily used by the visually handicapped.

In addition to reducing the number of service calls by constructing the pushbuttons to withstand high usage, abuse, and vandalism, they should be constructed to be easily and quickly serviced when service is necessary. For example, the light source in the pushbutton, or any other element of the pushbutton, must be easily and quickly replaceable by authorized personnel without the use of special tools.

Elevator systems are currently constructed with conventional electromechanical relays in the control, with low voltage solid state devices, or with a combination of the two. It would be desirable to construct the elevator pushbuttons in a modular manner such that they are assembled from completely interchangeable "building blocks", enabling high voltage light sources, such as neon lamps to be used, or low voltage solid state light sources, such as LEDs.

Regardless of the light source utilized, the resulting pushbutton structure must provide adequate illumination when actuated, to notify the user the call has been placed.

The hereinbefore mentioned co-pending application sets forth a new and improved pushbutton assembly which includes two basic sub-assemblies, a housing sub-assembly which carries the legend blocks to be illuminated, and an actuating plunger; and, a cover sub-assembly which carries the electrical contact assembly and the illuminating means. Assembly of the cover assembly with the housing assembly automatically aligns and operatively couples the actuating plunger with the electrical contact assembly, and it also automatically aligns the illuminating means with the legend blocks.

The illuminating means of the co-pending application may be any suitable light source, such as incandescent, neon, or solid state, such as LEDs.

It would be desirable to provide a new and improved solid state lighting arrangement suitable for use with certain of the components disclosed in the hereinbefore mentioned co-pending application. The new and improved solid state lighting arrangement must be compatible with the modular concept of this pushbutton system, it must adequately illuminate the legend blocks of the housing subassembly, it must be simple and rugged, in order to be consistent with the demanding requirements of elevator related pushbuttons, and it must be economically attractive.

SUMMARY OF THE INVENTION

Briefly, the present invention is a new and improved illuminable pushbutton assembly which includes a solid state light source. The new and improved pushbutton assembly is compatible with the housing sub-assembly of the hereinbefore mentioned co-pending application, but it is not limited to use therewith. The solid state light source includes first and second electrically interconnected printed circuit boards, with the electrical circuit of the solid state light source being divided between the two printed circuit boards. The first printed circuit board functions as the housing cover, and it also carries the electrical contact assembly. The second printed circuit board is carried by the first printed circuit board, in predetermined spaced relation therewith, with the electrical interconnections therebetween also functioning as stand-off posts to mechanically support the second printed circuit board close to the portion of the housing to be illuminated. The solid state light source, preferably a plurality of LEDs, is mounted on the second printed circuit board to locate the solid state light source immediately adjacent to the area to be illuminated.

BRIEF DESCRIPTION OF THE DRAWINGS

The invention may be better understood, and further advantages and uses thereof more readily apparent, when considered in view of the following detailed description of exemplary embodiments, taken with the accompanying drawings in which:

FIG. 6 is an end elevational view, in section, of the cover portion shown in FIG. 3, taken between and in the direction of arrows VI—VI;

FIG. 7 is a plan view of the circuit side of the printed circuit board shown in FIG. 3, taken between and in the direction of arrows VII—VII;

FIG. 9 is an elevational view of a light reflector shown in FIG. 2, which directs the light from the solid state light source to the portion of the housing to be illuminated;

FIG. 10 is an end elevational view of the light reflector shown in FIG. 9; and

FIG. 11 is a plan view of the light reflector shown in FIG. 9.

DESCRIPTION OF THE PREFERRED EMBODIMENTS

Figure 1:
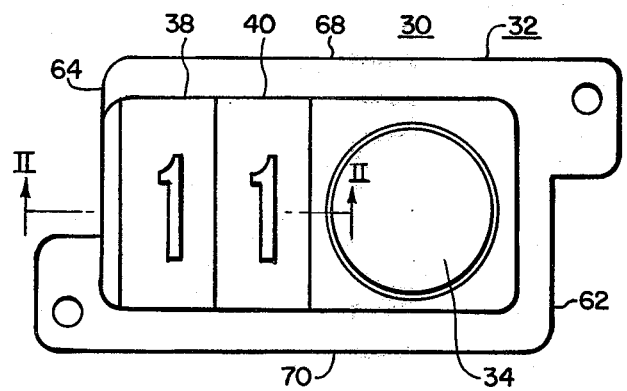
FIG. 1 is an elevational view of a pushbutton assembly which may be constructed according to the teachings of the invention.

Referring now to the drawings, and to FIG. 1 in particular, there is shown a pushbutton assembly 30 which may be constructed according to the teachings of the invention. For purposes of example, pushbutton 30 is illustrated with the ornamental design set forth in co-pending design application Ser. No. 791,369, filed Apr. 27, 1977, which is assigned to the assignee as the present application. However, it is to be understood that the new and improved pushbutton assembly 30 may have any desired appearance. Also, for purposes of example, it will be assumed that certain of the structural aspects are the same as those shown and claimed in the hereinbefore mentioned co-pending application Ser. No. 941,617 and thus this application is hereby incorporated into the present application by reference.

Figure 2:
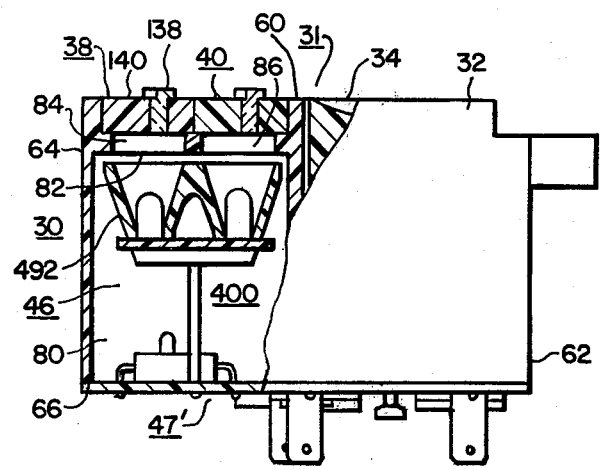
FIG. 2 is a cross-sectional view of a portion of the pushbutton assembly shown in FIG. 1, taken between and in the direction of arrows II—II, illustrating the teachings of the invention.

Pushbutton assembly 30 shown in FIG. 1 is shown partially in section in FIG. 2, with the partial section taken between and in the direction of arrows II—II in FIG. 1. Pushbutton assembly 30 includes a housing sub-assembly 31, and a cover sub-assembly 47'. The housing sub-assembly 31 includes a housing 32, an actuating plunger 34 carried by the housing 32, and legend blocks 38 and 40 fixed to housing 32.

Housing 32 includes a front portion 60, right and left hand portions, 62 and 64, respectively, a rear portion 66, and top and bottom portions 68 and 70, respectively. Housing 32 defines a major cavity 46 which includes a cylindrical recess for receiving the actuating member 34, and a sub-cavity for receiving an electrical contact assembly 54 shown in FIGS. 3 and 4. The remaining portion of cavity 46 includes a sub-cavity 80 formed between an inner surface 82 of the front portion 60 and the rear portion 66, with sub-cavity 80 being sized to receive illuminating means 400 constructed according to the teachings of the invention. Front portion 60 includes first and second openings 84 and 86 which communicate with sub-cavity 80, providing illumination ports for legend blocks 38 and 40, respectively. As illustrated in FIG. 2, the numbers 138 on the legend blocks 38 and 40 are raised, to aid the visually handicapped, and they are formed of light transmissive material such that the numbers "light-up" and are highlighted by an opaque surrounding surface 140.

Figure 4A:
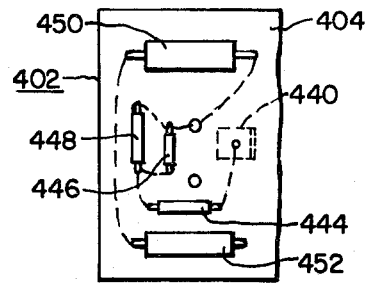
FIG. 4A is a fragmentary plan view of the internal side of the cover portion shown in FIG. 4, with the solid state light source and its associated printed circuit board removed.
Figure 4:
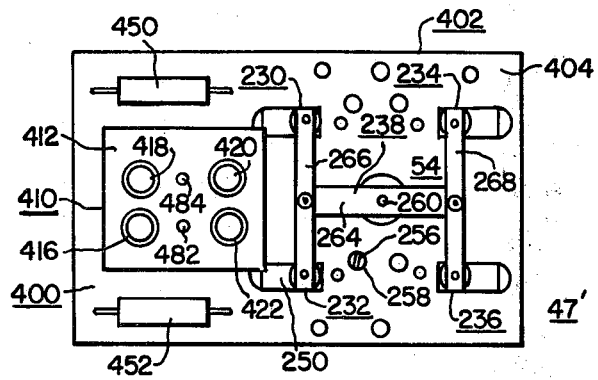
FIG. 4 is a plan view of the internal side of the cover portion shown in FIG. 3.
Figure 3:
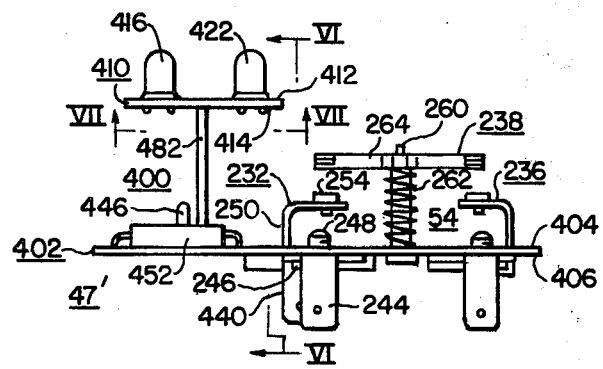
FIG. 3 is an elevational view of the cover portion of the pushbutton assembly shown in FIG. 1, which illustrates the teachings of the invention.
Figure 5:
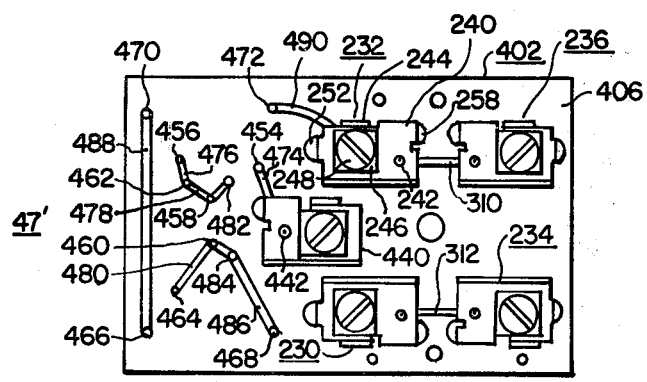
FIG. 5 is a plan view of the external side of the cover portion shown in FIG. 3.

The cover sub-assembly 47' is shown in greater detail in FIGS. 3, 4, 4A, 5, 6 and 7. FIG. 3 is a side elevational view of the cover assembly 47', and FIG. 6 is an end elevational view of the cover assembly 47' taken between and in the direction of arrows VI—VI in FIG. 3. FIG. 4 is a plan view of cover assembly 47', viewed from the side thereof which is disposed within cavity 80 of housing 32. FIG. 4A is a fragmentary plan view which is similar to that of FIG. 4, except certain parts have been removed. FIG. 5 is a plan view of cover assembly of 47', viewed from the external side thereof. FIG. 7 is a plan view of the circuit side of a printed circuit board shown in FIG. 3, taken between and in the direction of arrows VII—VII in FIG. 3. All of these Figures will be referred to in the following description of the cover sub-assembly 47'.

Cover sub-assembly 47' includes a first printed circuit board 402 which has first and second major opposed surfaces 404 and 406, respectively, with surface 404 being the component side which is within cavity 46 of housing 32 when the cover portion 47' is assembled with the housing portion 31. Surface 406 is the printed circuit side, which is external to the cavity 46.

Electrical contact assembly 54 is mounted on one end of the printed circuit board 402. Electrical contact assembly 54 includes a plurality of stationary contact members, with four stationary contacts 230, 232, 234 and 236 being shown, for purposes of example. A movable contact structure 238 completes the electrical contact assembly 54, with the movable contact structure 238 being illustrated to form two sets of normally open contacts, for purposes of example. In practice, contact assembly 54 may have one or more sets of contacts, normally open, normally closed, or both.

The stationary contacts may be of any suitable form, with a universal type of contact being illustrated. Since the stationary contacts are of like construction, only stationary contact 232 will be described in detail. Stationary contact 232 includes a base portion 240 disposed against the external side 406 of printed circuit board 402, with base 240 being secured to printed circuit board 402 with an eyelet 242. Base 240 includes a first member or portion 244 which extends outwardly or away from printed circuit board 402. Portion 244 is adapted to receive a slip-on type electrical terminal from an external electrical circuit. A compression plate 246 is also fastened to base 240 via a screw 248, permitting a bifurcated terminal, or a flexible lead, to be secured to base 240. Base 240 includes a second outwardly extending member or portion 250 which extends away from base 240 in a direction opposite to that of member 244, through an opening 252 in printed circuit board 402. Member 250 has its end bent parallel with surface 404 of printed circuit board 402, and spaced therefrom, with an electrical contact button 254 being secured thereto. Base 240 may have a portion 256 which is just long enough to enter an opening 258 in the printed circuit board. Portions 250 and 256 snuggly fit their associated openings, to properly orient the stationary terminal with the printed circuit board. An additional opening (not shown) is formed to through the printed circuit board 402 for receiving screw 248.

The movable contact structure 238 includes a spring pin 260, a spiral spring 262, an insulative arm 264, and first and second electrically conductive elongated bridging members 266 and 268, respectively, which carry electrical contact buttons on each end.

The illuminating means 400 includes electrical components mounted on the first printed circuit board 402, including a second printed circuit board 410 which is mounted on and spaced from the first printed circuit board 402. Printed circuit board 410 includes first and second major opposed surfaces 412 and 414, respectively, with surface 412 being the component side, and surface 414 being the printed circuit side. A plurality of solid state light sources, preferably light emitting diodes, are mounted on the component side 412 of the second printed circuit board 410. More specifically, the circuitry of the illuminating means 400 is divided between the two printed circuit boards 402 and 410, and the two printed circuit boards 402 and 410 are electrically interconnected. For purposes of example it will be assumed that four LED's 416, 418, 420 and 422 are mounted on side 412 of printed circuit board 410. As best illustrated in FIG. 7, LED 46 includes two terminals 424 and 426 plated through holes in printed circuit board 410. In like manner, LED 418 includes terminals 428 and 430, LED 420 includes terminals 432 and 434, and LED 422 includes terminals 436 and 438.

For purposes of example, it will be assumed that the electrical components mounted on printed circuit board 402 which are associated with illuminating means 400 include a terminal 440 fastened to printed circuit board 402 via an eyelet 442, a diode 444, a capacitor 446, and resistors 448, 450 and 452. As best shown in FIG. 5, diode 444 includes leads 454 and 456 plated through holes in printed circuit board 402. In like manner, capacitor 446 includes leads 458 and 460, resistor 448 includes leads 462 and 464, resistor 450 includes leads 466 and 468, and resistor 452 includes leads 470 and 472.

Figure 8:
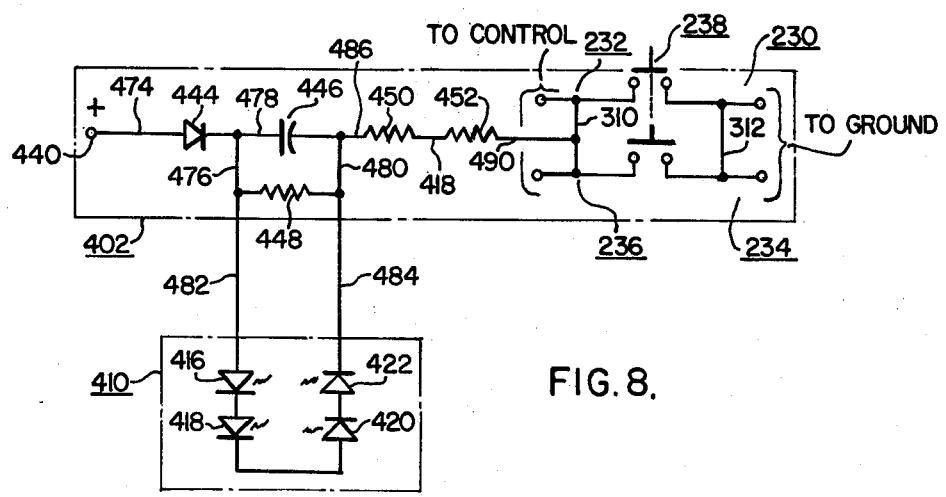
FIG. 8 is a schematic diagram of the electrical circuit of the cover portion shown in FIG. 3.

FIG. 8 is a schematic diagram illustrating the electrical connections of the various components on the two printed circuit boards 402 and 410. Referring to FIG. 8, and also to FIG. 5, terminal 440 is connected to lead 454 of diode 444 via printed conductor 474, lead 456 of diode 444 is connected to leads 462 and 458 of resistor 448 and capacitor 446, respectively, via printed conductors 476 and 478. Leads 460 and 464 of capacitor 446 and resistor 448, respectively, are connected in common via printed conductor 480. The commonly connected leads 462 and 458 of resistor 448 and capacitor 446, respectively, are connected to printed circuit board 410 via an upstanding conductor 482 which has one end connected to printed circuit board 402 via a plated through-hole. The commonly connected leads 464 and 460 of resistor 448 and capacitor 446, respectively, are connected to printed circuit board 410 via an upstanding conductor 484 which has one end connected to printed circuit board 402 via a plated through-hole. Conductor 484 is connected to lead 468 of resistor 450 via printed conductor 486, lead 466 of resistor 450 is connected to lead 470 of resistor 452 via printed conductor 488, lead 472 of resistor 452 is connected to stationary terminal 232 via printed conductor 490, terminal 232 is connected to terminal 236 via printed conductor 310, and terminal 230 is connected to terminal 234 via printed conductor 312.

Conductors 482 and 484 are formed of electrically conductive material having sufficient mechanical strength to support printed circuit board 410. Conductors 482 and 484 each have an end electrically connected to each of the printed circuit boards 402 and 410, with the longitudinal axes of conductors 482 and 484 being substantially perpendicular to the major surfaces of printed circuit boards 402 and 410. Printed circuit board 410 is thus mechanically supported from side 404 of printed circuit board 402, with the length of the electrical leads 482 and 484 which function to provide the mechanical support being selected to place the light emitting diodes 416, 418, 420 and 422 at an optimum location relative to the legend blocks 38 and 40 shown in FIGS. 1 and 2.

The effectiveness of the light emitting diodes 416, 418, 420 and 422 is enhanced by a reflector 492 shown in FIG. 2 and also in FIGS. 9, 10 and 11. FIGS. 9 and 10 are front and side elevational views, respectively, and FIG. 11 is a plan view of reflector 492. Reflector 492 defines a first cavity 494 having openings 496 and 498 at one end of the cavity for snugly receiving LED's 416 and 418 which illuminate legend block 38. Cavity 494 has four flared sides 498, 500, 502 and 504 which extend upwardly and outwardly from openings 496 and 498 at an angle of about 60° to 70° from a horizontal plane. The flared sides are coated with a white paint to enhance the light directing quality of the reflector. A second cavity 506 is constructed in like manner to the first cavity 494, to receive LED's 420 and 422 for illuminating legend block 40. The flared sides of cavities 492 and 506 extend to surface 82 of housing 32, to direct and concentrate the light from the LEDs on the legend blocks, while preventing light from escaping to other portions of the pushbutton assembly. Depending leg portions 508 and 510 are configured such that when reflector 492 is placed in position, the legs 508 and 510 will snap over opposite sides or edges of printed circuit board 410, to secure reflector 492 in the desired assembled position.

We claim as our invention:

1. An illuminable pushbutton assembly, comprising:
a housing having front and back sides, and a cavity accessible from the back side, said front side including a portion to be illuminated,
a first printed circuit board mounted on said housing,
a contact assembly mounted on said first printed circuit board,
an actuating member carried by said housing which is operatively coupled with said contact assembly,
and illuminating means including at least one solid state light source mounted on a second printed circuit board having an electrical circuit thereon connected to said at least one light source, electrical circuit elements mounted on said first printed circuit board having an electrical circuit thereon which interconnects said components, and stand-off means mounting said second printed circuit board on said first printed circuit board, said stand-off means rigidly spacing the second printed circuit board from the first printed circuit board, with the at least one light source adjacent to the portion of the housing to be illuminated, said stand-off means being formed of electrically conductive material and being electrically connected to the electrical circuits of both of said first and second printed circuit boards to provide a current carrying path between the first and second printed circuit boards as well as mechanical support for the second printed circuit board.

2. The pushbutton assembly of claim 1 wherein the first printed circuit board is mounted, adjacent to the back side of the housing, to function as a cover for the cavity therein.

3. The pushbutton assembly of claim 1 wherein the at least one light source includes at least one LED.

4. The pushbutton assembly of claim 1 wherein the at least one light source includes a plurality of LED's, interconnected via the electric circuit on the second printed board.

5. The pushbutton assembly of claim 1 including light focusing means carried by the second printed circuit board, which directs the light from said at least one light source to the portion of the housing to be illuminated.

* * * * *